(12) United States Patent
Tadakuma

(10) Patent No.: US 10,109,759 B2
(45) Date of Patent: Oct. 23, 2018

(54) SEMICONDUCTOR MODULE AND POWER CONVERSION DEVICE

(71) Applicant: Mitsubishi Electric Corporation, Tokyo (JP)

(72) Inventor: Toshiya Tadakuma, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/836,948

(22) Filed: Dec. 11, 2017

(65) Prior Publication Data

US 2018/0261713 A1    Sep. 13, 2018

(30) Foreign Application Priority Data

Mar. 10, 2017  (JP) ................. 2017-045677

(51) Int. Cl.

| | |
|---|---|
| *H01L 31/167* | (2006.01) |
| *H01L 31/0203* | (2014.01) |
| *H01L 31/02* | (2006.01) |
| *H01L 23/00* | (2006.01) |
| *H03K 17/795* | (2006.01) |
| *H02M 7/537* | (2006.01) |
| *H02P 27/06* | (2006.01) |

(52) U.S. Cl.
CPC ........... *H01L 31/167* (2013.01); *H01L 24/48* (2013.01); *H01L 31/0203* (2013.01); *H01L 31/02005* (2013.01); *H01L 31/02019* (2013.01); *H02M 7/537* (2013.01); *H03K 17/795* (2013.01); *H01L 2224/48137* (2013.01); *H01L 2224/48245* (2013.01); *H01L 2924/1033* (2013.01); *H01L 2924/10272* (2013.01); *H01L 2924/1203* (2013.01); *H01L 2924/12041* (2013.01); *H01L 2924/12043* (2013.01); *H01L 2924/13055* (2013.01); *H01L 2924/13091* (2013.01); *H01L 2924/14252* (2013.01); *H02P 27/06* (2013.01)

(58) Field of Classification Search
CPC ... H01L 25/167; H01L 31/162; H01L 31/167; H01L 31/02005; H01L 31/02019; H01L 31/0203
See application file for complete search history.

(56) References Cited

U.S. PATENT DOCUMENTS

| | | | |
|---|---|---|---|
| 2015/0060892 A1* | 3/2015 | Noguchi ............... | H01L 31/162 257/82 |
| 2016/0268240 A1* | 9/2016 | Okumura .............. | H01L 25/167 |

FOREIGN PATENT DOCUMENTS

JP    03-245769 A    11/1991

* cited by examiner

*Primary Examiner* — Cuong Q Nguyen
(74) *Attorney, Agent, or Firm* — Studebaker & Brackett PC

(57) ABSTRACT

A semiconductor module includes a photocoupler, a gate driving IC, and a switching element, and at least one of a first structure and a second structure, wherein the first structure is a structure where in a part of a surface of a first lead frame joined to a bottom surface electrode of a light-emitting element, a first conductive layer is disposed with an insulating layer interposed, and a top surface electrode of the light-emitting element, and the first conductive layer are electrically connected by a wire, and the second structure is a structure where in a part of a surface of a second lead frame joined to a bottom surface electrode of a light-receiving element, a second conductive layer is disposed with an insulating layer interposed, and a top surface electrode of the light-receiving element, and the second conductive layer are electrically connected by a wire.

7 Claims, 4 Drawing Sheets

SEMICONDUCTOR MODULE AND POWER CONVERSION DEVICE

BACKGROUND OF THE INVENTION

Field of the Invention

The present invention relates to a semiconductor module and a power conversion device, and particularly to a semiconductor module including a photocoupler, and a power conversion device.

Description of the Background Art

There has been a semiconductor module including a switching element, a reflux diode (referred to as a freewheel diode as well) connected to the switching element in reversely parallel, and a gate driving IC configured to drive the switching element. A configuration of including six switching elements and six reflux diodes enables a three-phase sine driving to be performed.

Inside the gate driving IC configured to drive the switching element on a high voltage side, a withstand voltage structure such as a level shift circuit and the like is provided, lest equipment on an input side of a control signal (MCU: Micro Controller Unit) should be destroyed by a high voltage. Moreover, there has been known a configuration in which in order to insulating the equipment on the input side of the control signal and a gate driving IC, a photocoupler (referred to as an optocoupler as well) is connected between them (e.g., refer to Japanese Patent Application No. 3-245769)

In the case where the photocoupler is disposed outside the gate driving IC, there has been a problem that a space for disposition and wiring, and a power supply for driving the photocoupler are required, which increases a size as a whole.

SUMMARY OF THE INVENTION

Object

An object of the present invention is to provide a semiconductor module incorporating a photocoupler to suppress an increase in size, and a power conversion device.

Configuration

A semiconductor module according to the present invention includes: a photocoupler configured to receive a control signal; a gate driving IC configured to receive the control signal through the photocoupler; and at least one switching element configured to be driven by the gate driving IC, the photocoupler including: a light-emitting element including a top surface electrode and a bottom surface electrode; and a light-receiving element including a top surface electrode and a bottom surface electrode, the semiconductor module further includes: a first lead frame with the bottom surface electrode of the light-emitting element joined thereto; a second lead frame with the bottom surface electrode of the light-receiving element joined thereto; a third lead frame with the gate driving IC disposed; and a sealing material configured to seal the photocoupler, the gate driving IC, the at least one switching element, and the first to third lead frames, and the semiconductor module further includes at least one of a first structure and a second structure, wherein the first structure is a structure where in a part of a surface of the first lead frame joined to the bottom surface electrode of the light-emitting element, a first conductive layer is disposed with an insulating layer interposed, and the top surface electrode of the light-emitting element, and the first conductive layer are electrically connected by a wire, and the second structure is a structure where in a part of a surface of the second lead frame joined to the bottom surface electrode of the light-receiving element, a second conductive layer is disposed with an insulating layer interposed, and the top surface electrode of the light-receiving element, and the second conductive layer are electrically connected by a wire.

Effects

According to the semiconductor module of the present invention, the photocoupler is disposed on the first and second lead frames and is incorporated. Since providing at least one of the first and second structures in the semiconductor module allows the wiring for the photocoupler to be disposed on the first or second lead frame, an increase in size of the semiconductor module caused by the incorporation of the photocoupler can be suppressed. Accordingly, the semiconductor module according to the present invention can be downsized as a whole, as compared with a configuration in which the photocoupler is disposed outside the semiconductor module.

Furthermore, incorporating the photocoupler in the semiconductor module makes it unnecessary to provide a withstand voltage structure such as a level shift circuit and the like inside the gate driving IC. Accordingly, a low-voltage IC can be applied as the gate driving IC. Moreover, since the withstand voltage structure becomes unnecessary for the gate driving IC, the downsizing of the gate driving IC becomes possible. Thus, the further downsizing of the semiconductor module becomes possible.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
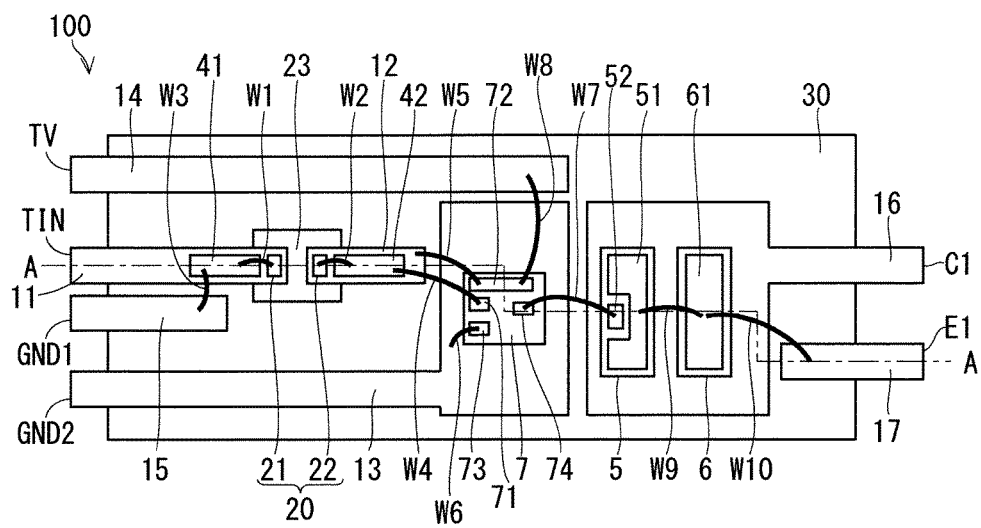
FIG. 1 is a plan diagram of a semiconductor module according to a first preferred embodiment.
Figure 2:
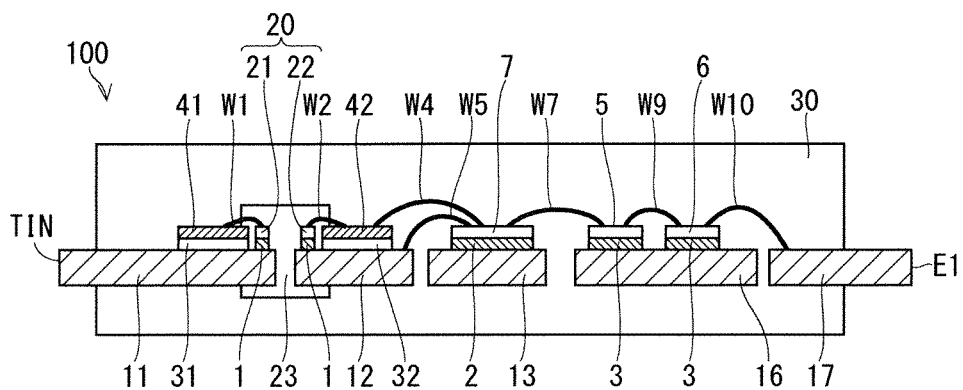
FIG. 2 is a cross-sectional diagram of the semiconductor module according to the first preferred embodiment.
Figure 3:
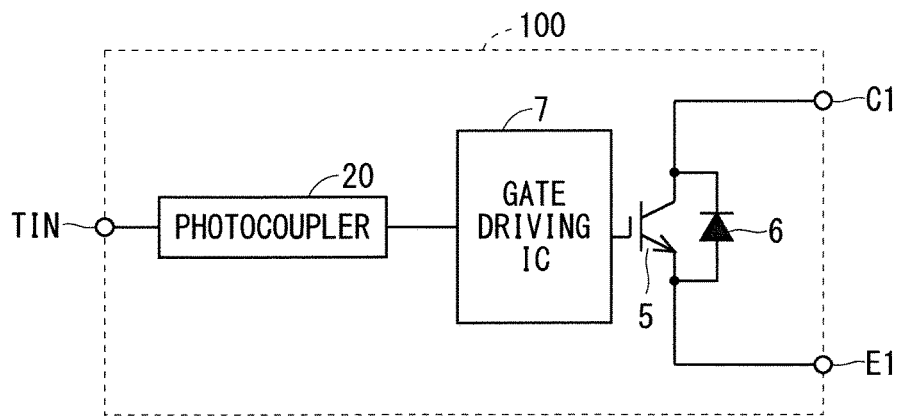
FIG. 3 is a diagram showing a configuration of the semiconductor module according to the first preferred embodiment.
Figure 4:
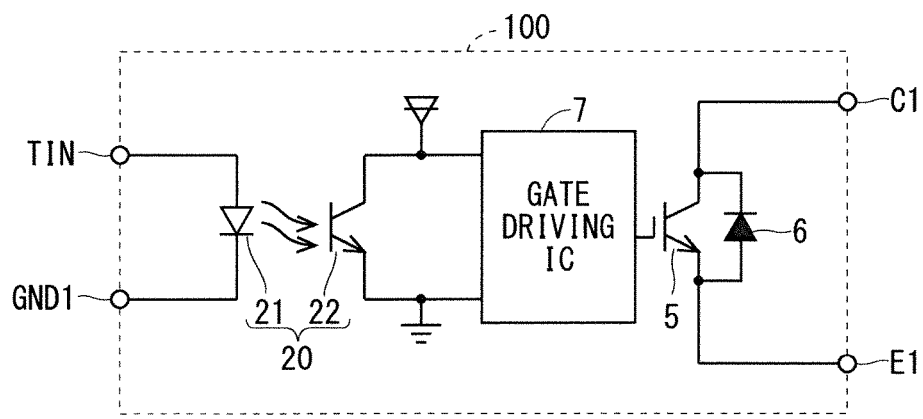
FIG. 4 is a circuit diagram of the semiconductor module according to the first preferred embodiment.

FIG. 1 is a plan diagram of a semiconductor module 100 in a present first preferred embodiment. FIG. 2 is a cross-sectional diagram of the semiconductor module 100 in line segment A-A in FIG. 1. Moreover, FIG. 3 is a diagram showing a configuration of the semiconductor module 100. FIG. 4 is a circuit diagram of the semiconductor module 100. In FIG. 1, for easy understanding, a sealing material 30 is transparently illustrated.

The semiconductor module 100 includes a photocoupler 20 configured to receive a control signal, a gate driving IC 7, and a switching element 5. The control signal to control switching of the switching element 5 is inputted to a signal terminal TIN of the semiconductor module 100. The control signal is once converted to an optical signal by a light-emitting element 21 of the photocoupler 20, and then, is reconverted to an electrical signal in a light-receiving element 22 of the photocoupler 20 to be inputted to a control electrode of the gate driving IC 7. The gate driving IC 7 drives a gate of the switching element 5, based on the control signal. This allows conduction and non-conduction between a terminal C1 and a terminal E1 of the semiconductor module 100 to be controlled. The switching element 5 and the reflux diode 6 may be connected in reversely parallel.

The light-emitting element 21 and the light receiving element 22 included in the photocoupler 20 are sealed by a light transmitting protection material 23. The light-emitting element 21 is, for example, an LED. The light-receiving element 22 is, for example, a photodiode. Each of the light-emitting element 21 and the light-receiving element 22 includes a top surface electrode and a bottom surface electrode.

As shown in FIG. 1, the semiconductor module 100 further includes first to third lead frames 11, 12, 13. To the first lead frame 11 is joined the bottom surface electrode of the light-emitting element 21 by a solder 1 or the like. To the second lead frame 12 is joined the bottom surface electrode of the light-receiving element 22 by the solder 1 or the like. To the third lead frame 13 is joined the gate driving IC 7 by metal, conductive resin or the like of a solder 2 or the like.

In the present first preferred embodiment, the semiconductor module 100 includes a first structure and a second structure. The first structure is a structure where in a part of a surface of the first lead frame 11 joined to the bottom electrode of the light-emitting element 21, a first conductive layer 41 is disposed with an insulating layer 31 interposed, and the top surface electrode of the light-emitting element 21 and the first conductive layer 41 are electrically connected by a wire W1.

Moreover, the second structure is a structure where in a part of a surface of the second lead frame 12 joined to the bottom electrode of the light-receiving element 22, a second conductive layer 42 is disposed with an insulating layer 32 interposed, and the top surface electrode of the light-receiving element 22 and the second conductive layer 42 are electrically connected by a wire W2.

Moreover, as shown in FIG. 1, the semiconductor module 100 further includes a feeding lead frame 14 configured to supply power to the gate driving IC 7, a grounding lead frame 15 of the light-emitting element 21, a lead frame 16 connected to a collector electrode of the switching element 5, a lead frame 17 connected to an emitter electrode of the switching element 5. The respective lead frames are formed of a metal material such as copper.

The photocoupler 20, the gate driving IC 7, the switching element 5, the reflux diode 6, the respective lead frames, and the respective wires are sealed by the sealing material 30. The sealing material 30 is, for example, an epoxy resin. The sealing is performed, for example, by a transfer mold method. As shown in FIG. 1, the control terminal TIN at an end portion of the first lead frame 11, a ground terminal GND2 at an end portion of the third lead frame 13, a power supply terminal TV at an end portion of the feeding lead frame 14, the terminal C1 of the lead frame 16, and the terminal E1 of the lead frame 17 are exposed from the sealing material 30.

The switching element 5 includes an emitter electrode 51 in a top surface, and the collector electrode (not shown) in a bottom surface. Moreover, the switching element 5 includes a control electrode 52 in a part of the top surface. The switching element 5 is a switching element for power conversion, and is, for example, a power semiconductor including SiC or GaN. The switching element 5 is, for example, an IGBT (Insulated Gate Bipolar Transistor), MOSFET (Metal-Oxide-Semiconductor Field-Effect Transistor) or the like. The collector electrode in the bottom surface of the switching element 5 is joined to a top surface of the lead frame 16 by a solder 3 or the like.

Moreover, the reflux diode 6 connected to the switching element 5 in reversely parallel includes an anode electrode 61 in a top surface, and a cathode electrode in a bottom surface (not shown). The cathode electrode of the reflux diode 6 is joined to the top surface of the lead frame 16 by the solder 3 or the like.

Moreover, as shown in FIG. 1, the first conductive layer 41 and the grounding lead frame 15 of the light-emitting element 21 are electrically connected by a wire W3. The second conductive layer 42 and a control signal input electrode 71 of the gate driving IC 7 are electrically connected by a wire W4. The second lead frame 12 and a power supply electrode 72 of the gate driving IC 7 are electrically connected by a wire W5. The third lead frame 13 and a ground electrode 73 of the gate driving IC 7 are electrically connected by a wire W6. A gate voltage output electrode 74 of the gate driving IC 7 and the control electrode 52 of the switching element 5 are electrically connected by a wire 7. The feeding lead frame 14 and the power supply electrode 72 of the gate driving IC 7 are electrically connected by a wire W8. The emitter electrode 51 of the switching element 5 and the anode electrode 61 of the reflux diode 6 are electrically connected by a wire 9. The anode electrode 61 of the reflux diode 6 and the lead frame 17 are electrically connected by a wire W10. Each of the wires is formed of, for example, aluminum.

While in the present first preferred embodiment, the configuration has been described, in which the semiconductor module 100 includes both the first structure and the second structure, the semiconductor module 100 only needs to include at least one of the first structure and the second structure.

<Effects>

The semiconductor module 100 in the present first preferred embodiment includes the photocoupler 20 configured to receive the control signal, the gate driving IC 7 configured to receive the control signal through the photocoupler 20, and the at least one switching element 5 configured to be driven by the gate driving IC 7, the photocoupler 20 including the light-emitting element 21 including the top surface electrode and the bottom surface electrode, and the light-receiving element 22 including the top surface electrode and the bottom surface electrode, the semiconductor module 100 further includes the first lead frame 11 with the bottom surface electrode of the light-emitting element 21 joined thereto, the second lead frame 12 with the bottom surface electrode of the light-receiving element 22 joined thereto, the third lead frame 13 with the gate driving IC 7 disposed, and the sealing material 30 configured to seal the photocoupler 20, the gate driving IC 7, the at least one switching element 5, and the first to third lead frames 11, 12, 13, and the semiconductor module 100 further includes at least one of the first structure and the second structure, wherein the first structure is a structure where in a part of the surface of the first lead frame 11 joined to the bottom surface electrode of the light-emitting element 21, the first conductive layer 41 is disposed with the insulating layer 31 interposed, and the top surface electrode of the light-emitting element 21 and the first conductive layer 41 are electrically connected by the wire W1, and the second structure is a structure where in a part of the surface of the second lead frame 12 joined to the bottom surface electrode of the light-receiving element 22, the second conductive layer 42 is disposed with the insulating layer 32 interposed, and the top surface electrode of the light-receiving element 22 and the second conductive layer 42 are electrically connected by the wire W2.

In the semiconductor module 100 in the present first preferred embodiment, the photocoupler 20 is disposed on the first and second lead frames 11, 12, and is incorporated. Since providing at least one of the above-described first and second structures allows the wiring for the photocoupler 20 to be disposed on the first or second lead frames, an increase in size of the semiconductor module 100 caused by the incorporation of the photocoupler 20 can be suppressed. Accordingly, the semiconductor module 100 in the present first preferred embodiment is enabled to be downsized as a whole, as compared with a configuration in which the photocoupler is disposed outside the semiconductor module.

Furthermore, incorporating the photocoupler 20 in the semiconductor module 100 makes it unnecessary to provide a withstand voltage structure such as a level shift circuit and the like inside the gate driving IC 7. Accordingly, a low-voltage IC can be applied as the gate driving IC 7. Moreover, since the withstand voltage structure becomes unnecessary for the gate driving IC 7, the downsizing of the gate driving IC 7 becomes possible. Thus, the further downsizing of the semiconductor module 100 becomes possible.

Moreover, the semiconductor module 100 in the present first preferred embodiment includes the second structure, and the second conductive layer 42 and the control signal input electrode 71 of the gate driving IC 7 are electrically connected by the wire W4. This allows the top surface electrode of the light-receiving element 22 and the control signal input electrode 71 of the gate driving IC 7 to be electrically connected through the second conductive layer 42 and the wire W4. Accordingly, the control signal outputted by the light-receiving element 22 can be inputted to the gate driving IC 7.

Second Preferred Embodiment

Figure 5:
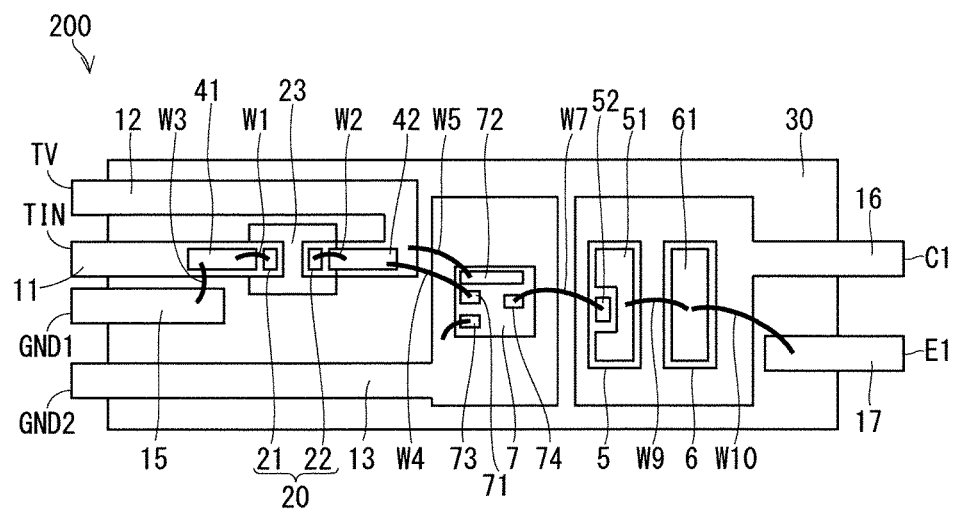
FIG. 5 is a plan diagram of a semiconductor module according to a second preferred embodiment.

FIG. 5 is a plan diagram of a semiconductor module 200 in the present second preferred embodiment. In FIG. 5, for easy understanding, a sealing material 30 is transparently illustrated. In the semiconductor module 200, a configuration is employed, in which the feeding lead frame 14 in the first preferred embodiment (FIG. 1) is integrated with a second lead frame 12. Configurations other than the second frame 12 are the same as those in the first preferred embodiment (FIG. 1), and thus, descriptions thereof will be omitted.

In the semiconductor module 200, a power is supplied to a gate driving IC 7 through the second lead frame 12. Similar to the first preferred embodiment, a light-receiving element 22 of a photocoupler 20 is joined to a top surface of the second lead frame 12.

<Effects>

In the semiconductor module 200 in the present second preferred embodiment, the second lead frame 12 and a power supply electrode 72 of the gate driving IC 7 are electrically connected by a wire W5 to supply a power supply voltage of the gate driving IC 7 to the second lead frame 12.

Accordingly, the light-receiving element 22 of the photocoupler 20 is joined to the top surface of the second lead frame 12 configured to supply the power supply voltage to the gate driving IC 7, by which downsizing of the semiconductor module 200 is possible, as compared with a configuration in which a lead frame for the light-receiving element 22 of the photocoupler 20 is provided separately.

Third Preferred Embodiment

Figure 6:
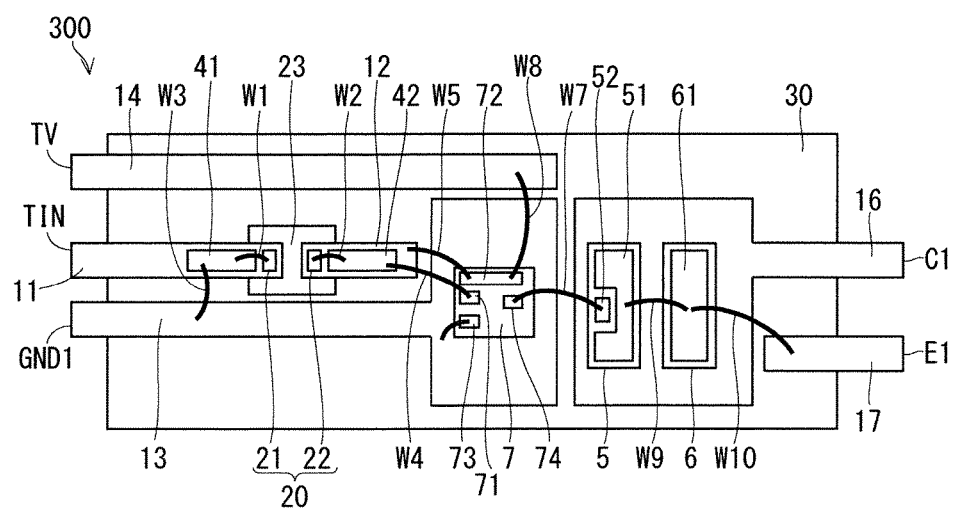
FIG. 6 is a plan diagram of a semiconductor module according to a third preferred embodiment.

FIG. 6 is a plan diagram of a semiconductor module 300 in the present third preferred embodiment. In FIG. 6, for easy understanding, a sealing material 30 is transparently illustrated. The semiconductor module 300 has a configuration such that a third lead frame 13 serves as both a ground of a gate driving IC 7 and a ground of a light-emitting element 21 of a photocoupler 20.

In the first preferred embodiment (FIG. 1), the first conductive layer 41 is connected to the grounding lead frame 15 by the wire W3. On the other hand, the semiconductor module 300 of the present third preferred embodiment does not include the grounding lead frame 15, and a first conductive layer 41 is connected to the third lead frame 13 by a wire 3. Other configurations are the same as those in the first preferred embodiment (FIG. 1), and thus, descriptions thereof will be omitted.

<Effects>

The semiconductor module 300 in the present third preferred embodiment includes a first structure, the third lead frame 13 is connected to a ground electrode 73 of the gate driving IC 7, and the first conductive layer 41 and the third lead frame 13 are electrically connected by the wire 3.

Accordingly, since the third lead frame 13 can serve as both the ground of the gate driving IC 7 and the ground of the light-emitting element 21 of the photocoupler 20, the downsizing of the semiconductor module 300 is possible.

Fourth Preferred Embodiment

Figure 7:
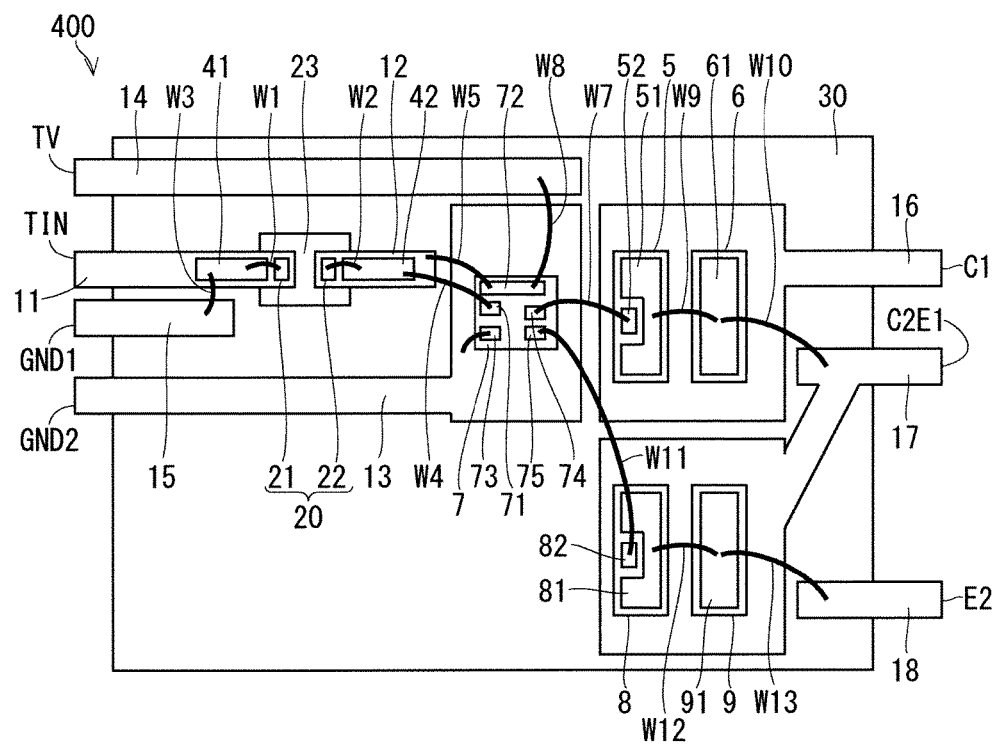
FIG. 7 is a plan diagram of a semiconductor module according to a fourth preferred embodiment.

FIG. 7 is a plan view of a semiconductor module 400 in the present fourth preferred embodiment. In FIG. 7, for easy understanding, a sealing material 30 is transparently illustrated. In the present fourth preferred embodiment, the semiconductor module 400 includes a switching element 5 on a high potential side and a switching element 8 on a low potential side. To the switching element 5 on the high potential side and the switching element 8 on the low potential side are connected reflux diodes 6, 9 in reversely parallel, respectively.

In the semiconductor module 400, a gate driving IC 7 is a half bridge IC configured to drive the switching element 5 on the high potential side and the switching element 8 on the low potential side. That is, the gate driving IC 7 turns on/off the switching element 5 on the high potential side and the switching element 8 on the low potential side at reverse timing to each other, based on a control signal inputted to a control signal input electrode 71 through a photocoupler 20.

A collector electrode (not shown) in a bottom surface of the switching element 8 on the low potential side is joined to a top surface of a lead frame 17 by solder or the like. Moreover, a cathode electrode (not shown) of the reflux diode 9 is joined to the top surface of the lead frame 17 by solder or the like.

Moreover, a gate voltage output electrode 75 on the low potential side of the gate driving IC 7 and a control electrode 82 of the switching element 8 on the low potential side are electrically connected by a wire W11. An emitter electrode 81 of the switching element 8 and an anode electrode 91 of the reflux diode 9 are electrically connected by a wire W12. The anode electrode 91 of the reflux diode 9 and a lead frame 18 are electrically connected by a wire W13. A terminal C1 of a lead frame 16 corresponds to a collector of the switching element 5 on the high potential side. A terminal C2E1 of the lead frame 17 corresponds to an emitter of the switching element 5 on the high potential side, and a collector of the switching element 8 on the low potential side. A terminal E2 of the lead frame 18 corresponds to an emitter of the switching element 8 on the high potential side.

<Effects>

In the semiconductor module 400 in the present fourth preferred embodiment, the switching element includes the switching element 5 on the high potential side and the switching element 8 on the low potential side element, and the gate driving IC 7 is a half bridge IC configured to turn on/off the switching element 5 on the high potential side and the switching element 8 on the low potential side at reverse timing to each other. Configuring the gate driving IC 7 by the half bridge IC enables both the switching element 5 on the high potential side and the switching element 8 on the low potential side to be driven by one system of control signal, that is, by the one photocoupler 20. Accordingly, as compared with a configuration in which two photocouplers 20 and two gate driving ICs are included, downsizing of the semiconductor module is possible.

Fifth Preferred Embodiment

In the present fifth preferred embodiment, the semiconductor module 100, 200, 300, 400 in any of the above-described first to fourth preferred embodiments is applied to a power conversion device. As one example of the power conversion device, a power conversion device 500 of a three-phase invertor will be described.

Figure 8:
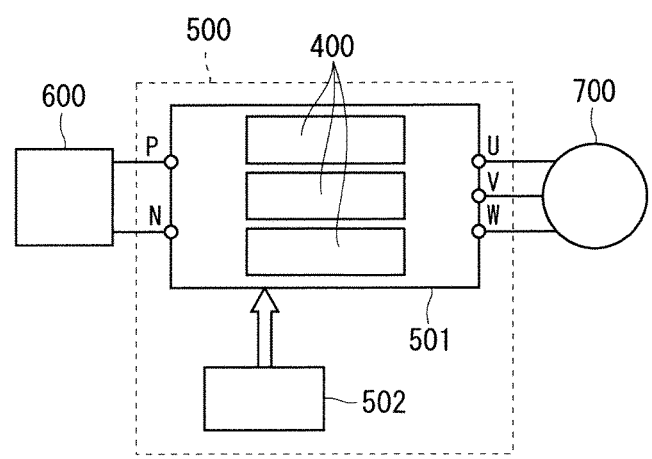
FIG. 8 is a diagram showing a configuration of a power conversion system according to a fifth preferred embodiment.

FIG. 8 is a diagram showing a configuration of a power conversion system in the present fifth preferred embodiment. The power conversion device 500 shown in FIG. 8 is connected to a power supply 600 and a load 700. The power supply 600 is a DC power supply, and supplies a DC power to the power conversion device 500. The power supply 600 can be configured in various types, and for example, can be configured by a DC system, a solar cell, a storage battery or the like. Moreover, the power supply 600 may be configured by a rectifier circuit, an AC/DC convertor or the like connected to an AC system. Moreover, the power supply 600 may be configured by a DC/DC converter configured to convert a DC power outputted from a DC system to a predetermined power.

The power conversion device 500 is a three-phase invertor connected between the power supply 600 and the load 700. The power supply conversion device 500 converts the DC power supplied from the power supply 600 to an AC power to supply the AC power to the load 700. As shown in FIG. 8, the power conversion device 500 includes a power conversion circuit 501 and a control circuit 502. The control circuit 502 outputs, to the power conversion circuit 501, a control signal configured to control switching operation of the power conversion circuit 501. The power conversion circuit 501 converts the DC power to the AC power, based on the control signal, and outputs the resultant.

The power conversion circuit 501 is, for example, a two-level, three-phase full bridge circuit. For example, the three semiconductor modules 400 corresponding to a U phase, a V phase, and a W phase are included. The power conversion circuit 501 may include the six semiconductor modules 100 in place of the three semiconductor modules 400. Moreover, the semiconductor modules 100 may be the semiconductor modules 200 300.

The load 700 is a three-phase motor driven by the AC power supplied from the power conversion device 500. The load 700 is not limited to a specific purpose, but may be a motor mounted on each of various electrical instruments. The load 700 is, for example, a motor for a hybrid automobile, an electric automobile, a railway vehicle, an elevator, or an air conditioner.

While a description has been given on the assumption that the power conversion circuit 501 is the three-phase full bridge circuit, the present invention is not limited thereto, but the power conversion circuit 501 may be any circuit that has at least any one of the semiconductor modules 100, 200, 300, 400, and converts the power.

<Effects>

The power conversion device 500 in the present fifth preferred embodiment includes the power conversion circuit 501 configured to convert the inputted power and output the resultant, and the control circuit 502 configured to output the control signal to the power conversion circuit 501, and the power conversion circuit 501 includes at least any one of the semiconductor modules 100, 200, 300, 400.

As described in the first to fourth preferred embodiments, the semiconductor modules 100, 200, 300, 400 can suppress an increase in size, and each incorporate the photocoupler 20. Accordingly, an increase in size of the power conversion device 500 including the semiconductor module can also be suppressed.

In the first to fifth preferred embodiments, the switching elements 5, 8 included in the semiconductor modules 100, 200, 300, 400 each include a power semiconductor containing SiC or GaN. In the switching element handling a large current and a high voltage, such as for a power conversion purpose, especially high insulation is required of the gate driving IC 7. Accordingly, it is especially effective that the semiconductor module of the present invention, which incorporates the photocoupler 20 in the gate driving IC 7, has the configuration including the switching element including the power semiconductor containing SiC or GaN.

While the invention has been shown and described in detail, the foregoing description is in all aspects illustrative and not restrictive. It is therefore understood that numerous modifications and variations can be devised without departing from the scope of the invention.

What is claimed is:

1. A semiconductor module comprising:
   a photocoupler configured to receive a control signal;
   a gate driving IC configured to receive said control signal through said photocoupler; and
   at least one switching element configured to be driven by said gate driving IC,
   the photocoupler comprising:
   a light-emitting element including a top surface electrode and a bottom surface electrode; and
   a light-receiving element including a top surface electrode and a bottom surface electrode,
   the semiconductor module further comprising:
   a first lead frame with said bottom surface electrode of said light-emitting element joined thereto;

a second lead frame with said bottom surface electrode of said light-receiving element joined thereto;

a third lead frame with said gate driving IC disposed; and a sealing material configured to seal said photocoupler, said gate driving IC, said at least one switching element, and said first to third lead frames, and the semiconductor module further comprising at least one of a first structure and a second structure, wherein the first structure is a structure where in a part of a surface of said first lead frame joined to the bottom surface electrode of said light-emitting element, a first conductive layer is disposed with an insulating layer interposed, and said top surface electrode of said light-emitting element, and said first conductive layer are electrically connected by a wire, and said second structure is a structure where in a part of a surface of said second lead frame joined to the bottom surface electrode of said light-receiving element, a second conductive layer is disposed with an insulating layer interposed, and said top surface electrode of said light-receiving element, and said second conductive layer are electrically connected by a wire.

2. The semiconductor module according to claim 1 comprising said second structure, wherein said second conductive layer and a control signal input electrode of said gate driving IC are electrically connected by a wire.

3. The semiconductor module according to claim 2, wherein said second lead frame and a power supply electrode of said gate driving IC are electrically connected by a wire, and said second lead frame is supplied with a power supply voltage of said gate driving IC.

4. The semiconductor module according to claim 1 comprising said first structure, wherein said third lead frame is connected to a ground electrode of said gate driving IC, and said first conductive layer and said third lead frame are electrically connected by a wire.

5. The semiconductor module according to claim 1, wherein said at least one switching element includes a switching element on a high potential side and a switching element on a low potential side, and said gate driving IC is a half bridge IC configured to turn on/off said switching element on the high potential side and said switching element on the low potential side at reverse timing to each other.

6. The semiconductor module according to claim 1, wherein said at least one switching element includes a power semiconductor containing SiC or GaN.

7. A power conversion device comprising:

a power conversion circuit configured to convert an inputted power and output the resultant; and a control circuit configured to output a control signal to said power conversion circuit, wherein said power conversion circuit includes at least one semiconductor module according to claim 1.

* * * * *